US007000467B2

(12) United States Patent
Chu et al.

(10) Patent No.: US 7,000,467 B2
(45) Date of Patent: Feb. 21, 2006

(54) METHOD, SYSTEM AND PROGRAM PRODUCT FOR MONITORING RATE OF VOLUME CHANGE OF COOLANT WITHIN A COOLING SYSTEM

(75) Inventors: Richard C. Chu, Hopewell Junction, NY (US); Michael J. Ellsworth, Jr., Lagrangeville, NY (US); Roger R. Schmidt, Poughkeepsie, NY (US); Robert E. Simons, Poughkeepsie, NY (US); Randy J. Zoodsma, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 10/736,947

(22) Filed: Dec. 16, 2003

(65) Prior Publication Data

US 2005/0126276 A1 Jun. 16, 2005

(51) Int. Cl.
*G01F 23/00* (2006.01)
(52) U.S. Cl. .......................................... 73/299; 73/49.2
(58) Field of Classification Search .................. 73/299, 73/149, 861.49, 302, 49.2; 361/687–689
See application file for complete search history.

(56) References Cited

U.S. PATENT DOCUMENTS 3,338,261 A * 8/1967 Bergeson et al. ........... 137/386
3,696,362 A * 10/1972 Sieron ........................ 340/620
3,734,123 A * 5/1973 Pomerantz .................. 137/392
3,757,317 A * 9/1973 Kahn et al. ................. 137/386
3,787,733 A * 1/1974 Peters ........................ 307/118
3,916,213 A * 10/1975 Luteran ...................... 307/118
3,939,383 A 2/1976 Alm ........................... 317/123
3,969,923 A 7/1976 Howell .................... 73/40.5 R
3,992,894 A * 11/1976 Antonetti et al. ............. 62/129
4,024,887 A 5/1977 McGregor .................. 137/386
4,531,405 A 7/1985 Leister ........................ 73/290

(Continued)

FOREIGN PATENT DOCUMENTS

JP 7091711 A 4/1995

(Continued)

OTHER PUBLICATIONS

Chu et al., "Scalable Coolant Conditioning Unit with Integral Plate Heat Exchanger/Expansion Tank and Method of Use", Sep. 13, 2002, Pending U.S. Appl. No. 10/243,708, 29 pages.

(Continued)

*Primary Examiner*—Hezron Williams
*Assistant Examiner*—John Fitzgerald
(74) *Attorney, Agent, or Firm*—Lily Neff, Esq.; Kevin P. Radigan, Esq.; Heslin Rothenberg Farley & Mesiti, P.C.

(57) ABSTRACT

Method, system and program product are provided for monitoring coolant within a cooling system designed to provide system coolant to one or more electronics subsystems. The monitoring technique includes employing at least one pressure transducer to obtain multiple pressure measurements related to an amount of coolant within an expansion tank of the cooling system, and determining a rate of volume change of coolant within the expansion tank employing the multiple pressure measurements. Successive pressure measurements can be taken at a known time interval to determine the rate of volume change of coolant within the expansion tank. An automatic determination can also be made on the immediacy of action to be taken for service of the cooling system based on the rate of volume change of coolant within the expansion tank.

15 Claims, 6 Drawing Sheets

U.S. PATENT DOCUMENTS

| | | | | |
|---|---|---|---|---|
| 4,646,560 | A * | 3/1987 | Maresca et al. | 73/49.2 |
| 4,747,062 | A * | 5/1988 | Esau | 702/55 |
| 4,791,814 | A * | 12/1988 | Nee | 73/49.2 |
| 4,852,054 | A * | 7/1989 | Mastandrea | 702/51 |
| 4,862,734 | A * | 9/1989 | Elderton | 73/49.2 |
| 4,964,296 | A * | 10/1990 | Jensen | 73/49.2 |
| 5,245,869 | A * | 9/1993 | Clarke et al. | 73/149 |
| 5,283,552 | A | 2/1994 | Sol | 340/605 |
| 5,323,847 | A * | 6/1994 | Koizumi et al. | 165/104.33 |
| 5,351,725 | A * | 10/1994 | Suthergreen et al. | 141/1 |
| 5,557,965 | A | 9/1996 | Fiechtner | 73/49.2 |
| 5,604,315 | A * | 2/1997 | Briefer et al. | 73/861.49 |
| 5,632,302 | A | 5/1997 | Lenoir, Jr. | 137/312 |
| 5,698,117 | A | 12/1997 | Doutt | 219/86.31 |
| 5,705,747 | A * | 1/1998 | Bailey | 73/290 R |
| 5,913,236 | A | 6/1999 | Wodeslavsky | 73/40 |
| 6,401,525 | B1 | 6/2002 | Jamieson | 73/40.5 R |
| 6,621,707 | B1 * | 9/2003 | Ishimine et al. | 361/721 |
| 6,687,643 | B1 * | 2/2004 | Cason, Jr. | 702/137 |
| 6,714,412 | B1 * | 3/2004 | Chu et al. | 361/699 |
| 6,807,056 | B1 * | 10/2004 | Kondo et al. | 361/689 |
| 6,854,320 | B1 * | 2/2005 | Wolford et al. | 73/49.2 |
| 2002/0075648 | A1 | 6/2002 | Nakagawa et al. | 361/690 |

FOREIGN PATENT DOCUMENTS

| | | | |
|---|---|---|---|
| JP | 9178200 | A | 7/1997 |
| JP | 11294851 | A | 10/1999 |
| JP | 2000146672 | A | 5/2000 |
| JP | 2001218682 | A | 8/2001 |

OTHER PUBLICATIONS

Simons, Robert E., "The Evolution of IBM High Performance Cooling Technology", Dec. 1995, 7 pages, IEEE Transactions on Components, Packaging, and Manufacturing Technology—Part A, vol. 18, No. 4.

* cited by examiner

METHOD, SYSTEM AND PROGRAM PRODUCT FOR MONITORING RATE OF VOLUME CHANGE OF COOLANT WITHIN A COOLING SYSTEM

CROSS REFERENCE TO RELATED APPLICATIONS

This application contains subject matter which is related to the subject matter of the following applications, each of which is assigned to the same assignee as this application and each of which is hereby incorporated herein by reference in its entirety:

"Method, System and Program Product For Automatically Checking Coolant Loops Of A Cooling System For A Computing Environment," Chu et al., Ser. No. 10/736,944, co-filed herewith; and "Scalable Coolant Conditioning Unit with Integral Plate Heat Exchanger/Expansion Tank and Method of Use," Chu et al., Ser. No. 10/243,708, filed Sep. 13, 2002.

TECHNICAL FIELD

The present invention relates in general to cooling assemblies and other apparatus used for removing heat from electronic devices, modules and systems. More particularly, this invention relates to methods and systems for monitoring a rate of volume change of coolant within a cooling system designed, for example, to cool one or more electronics subsystems, such as electronics racks, of a computing environment.

BACKGROUND OF THE INVENTION

Heat flux dissipated by electronic equipment, such as microprocessors and power supplies, is again reaching levels that require cooling other than simple air cooling as a means of controlling component temperature. Liquid cooling (e.g., water cooling) is an attractive technology to manage these higher heat fluxes. The liquid absorbs the heat dissipated by the component/modules in an efficient manner, i.e., with minimal temperature rise from the liquid to the component being cooled. Typically, the heat is ultimately transferred from the liquid out into the outside environment. Otherwise, the liquid coolant would continuously rise in temperature.

From the 1970's through the early 1990's, International Business Machines Corporation accomplished this task by circulating cooling liquid via a coolant distribution unit which was a single, large computer room water conditioning unit (CRWCU). The CRWCU distributed conditioned chilled water to the various electronics racks of a mainframe computer system to be cooled. Conventionally, the electronics racks of the mainframe computer included memory frames, processor frames, input/output frames, power frames, etc. Operationally, the CRWCU received customer chilled water which was then used to remove heat from conditioned cooled water to the individual electronics racks of the computer room.

The CRWCU included a primary cooling loop wherein building chilled water was supplied and passed through a control valve driven by a motor. The valve determined an amount of building chilled water to be passed through a heat exchanger, with a portion of the building chilled water possibly being returned directly to the return via a bypass orifice. The CRWCU further included a second cooling loop with a reservoir tank from which water was pumped either by one of two pumps into the heat exchanger for conditioning and output therefrom as a conditioned water source to the electronics racks to be cooled within the computer room. The computer room water conditioning unit normally stood separate from the electronics frames, and again, would supply system water (typically maintained at about 22° C.) to all electronics frames of the computer room.

The coolant distribution unit, and more particularly, the computer room water conditioning unit (CRWCU), contained a single heat exchanger, a single reservoir, a single control valve, and redundant pumps. Thus, in the case of a failed pump, the CRWCU would automatically switch to the redundant pump, but any other malfunction in the coolant distribution unit would have brought down the whole computer room mainframe system. For example, if the heat exchanger, or control valve, or building chilled water source failed, the entire mainframe system in the computer room would also fail. Redundant mainframe computers would have been on the computer room floor to allow continuation of processing (in a degraded mode) until the downed mainframe could be repaired.

SUMMARY OF THE INVENTION

Today, a multi-frame mainframe system such as existed in the 1970's and 1980's has been replaced with single processor frames or racks. Thus, multiple processor frames, from high end, mid-range and low end could now be sourced from a single computer room water conditioning unit. Therein lies a problem, however. Any leak in any of the processor frames could cause all of the frames to lose conditioned water. A single leak could bring down the entire computer room floor.

With today's critical demand for high availability of electronics systems, it is desirable to have a technique for monitoring not just volume of coolant within the cooling system, but also the rate of volume change of coolant within the cooling system as a means of providing early detection of a leak within the system, i.e., before coolant within the system reaches a critically low level necessitating shutting down of the cooling system, as well as the associated electronics system.

Thus, the shortcomings of the prior art are overcome and additional advantages are provided through the provision of a method of monitoring coolant within a cooling system. The method includes: employing at least one pressure transducer to obtain multiple pressure measurements related to an amount of coolant within an expansion tank of the cooling system; and determining a rate of volume change of coolant within the expansion tank employing the multiple pressure measurements.

In enhanced aspects, the employing includes obtaining multiple successive pressure measurements related to the amount of coolant within the expansion tank of the cooling system, the multiple successive pressure measurements being taken at a known time interval, and the determining includes employing the multiple successive pressure measurements at the known time interval to determine the rate of volume change of coolant within the expansion tank. The method may also include determining an immediacy of action to be taken to service the cooling system based on the rate of volume change of coolant within the expansion tank. Further, the employing could comprise obtaining multiple differential pressure measurements on the amount of coolant within the expansion tank, each differential pressure measurement including a difference in pressure between pressure in a liquid coolant portion of the expansion tank and pressure in a non-liquid portion of the expansion tank.

Systems and computer program products corresponding to the above summarized methods are also described and claimed herein.

Further, additional features and advantages are realized through the techniques of the present invention. Other embodiments and aspects of the invention are described in detail herein and are considered a part of the claimed invention.

BRIEF DESCRIPTION Of THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As used herein "electronics subsystem" comprises any housing, frame, rack, compartment, etc., containing one or more heat generating components of a computer system or other electronics system requiring cooling. The term "electronics rack" includes any frame or rack having a heat generating component of a computer system or electronics system; and may be, for example, a stand alone computer processor having high, mid or low end processing capability. In one embodiment, an electronics rack may comprise multiple electronics drawers, each having one or more heat generating components requiring cooling.

One example of coolant within the coolant distribution unit is water. However, the concepts disclosed are readily adapted to use with other types of coolant on both the facility side and the system side. For example, the coolant may comprise a brine, a fluorocarbon liquid, or other similar chemical coolant or a refrigerant, while still maintaining the advantages and unique features of the present invention.

As noted briefly above, power levels in computer equipment (primarily processors) have again risen to a level where they no longer can be simply air cooled. The components will likely be water cooled. Heat dissipated by the processor can be transferred to the water via a water cooled cold plate. Water typically available at customer locations (i.e., data centers) is not suitable for use in these cold plates. First, condensation formation is a concern as the temperature of the data center water, ranging from 7° C. to 15° C., is far below the room dew point (typically 18–23° C.). Second, the relatively poor quality of the water (its chemistry, cleanliness, etc.) impacts system reliability. It is therefore desirable to utilize a water cooling/conditioning unit that circulates high quality water to/from the electronics to be cooled and rejects the heat to the data center water. As used herein, "facility water" or "facility coolant" refers to this data center water or coolant, while "system water" or "system coolant" refers to the cooled/conditioned water or coolant, respectively, circulating between the coolant distribution unit and the electronics subsystem(s) being cooled.

Figure 1:
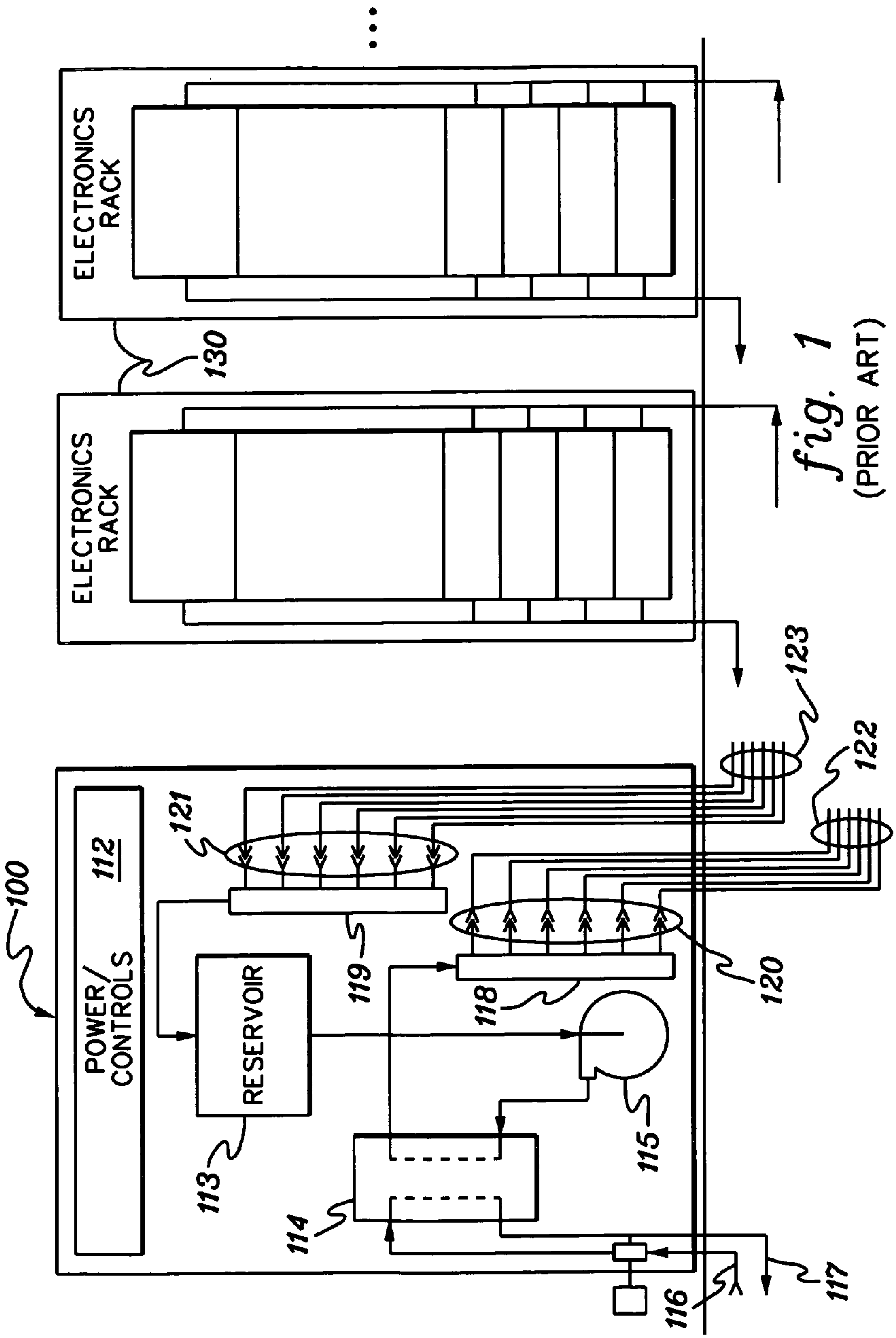
FIG. 1 depicts a conventional computer room water conditioning unit (CRWCU) for cooling electronics racks of a computing environment.

Reference is now made to the drawings, wherein the same reference numbers used throughout different figures designate the same or similar components. FIG. 1 depicts one embodiment of a conventional coolant distribution unit 100 for a computer room. The cooling unit was relatively large and occupied more than what would now be considered as two full electronics frames. Within the cooling unit was a power/control element 112, a reservoir/expansion tank 113, a heat exchanger 114, a pump 115 (often accompanied by a redundant second pump), customer water (or site or facility service water or coolant) inlet 116 and outlet 117 supply pipes, a supply manifold 118 directing water to the electronics frames 130 via couplings 120 and lines 122, and a return manifold 119 directing water from the electronics frames 130, via lines 123 and couplings 121.

Figure 2:
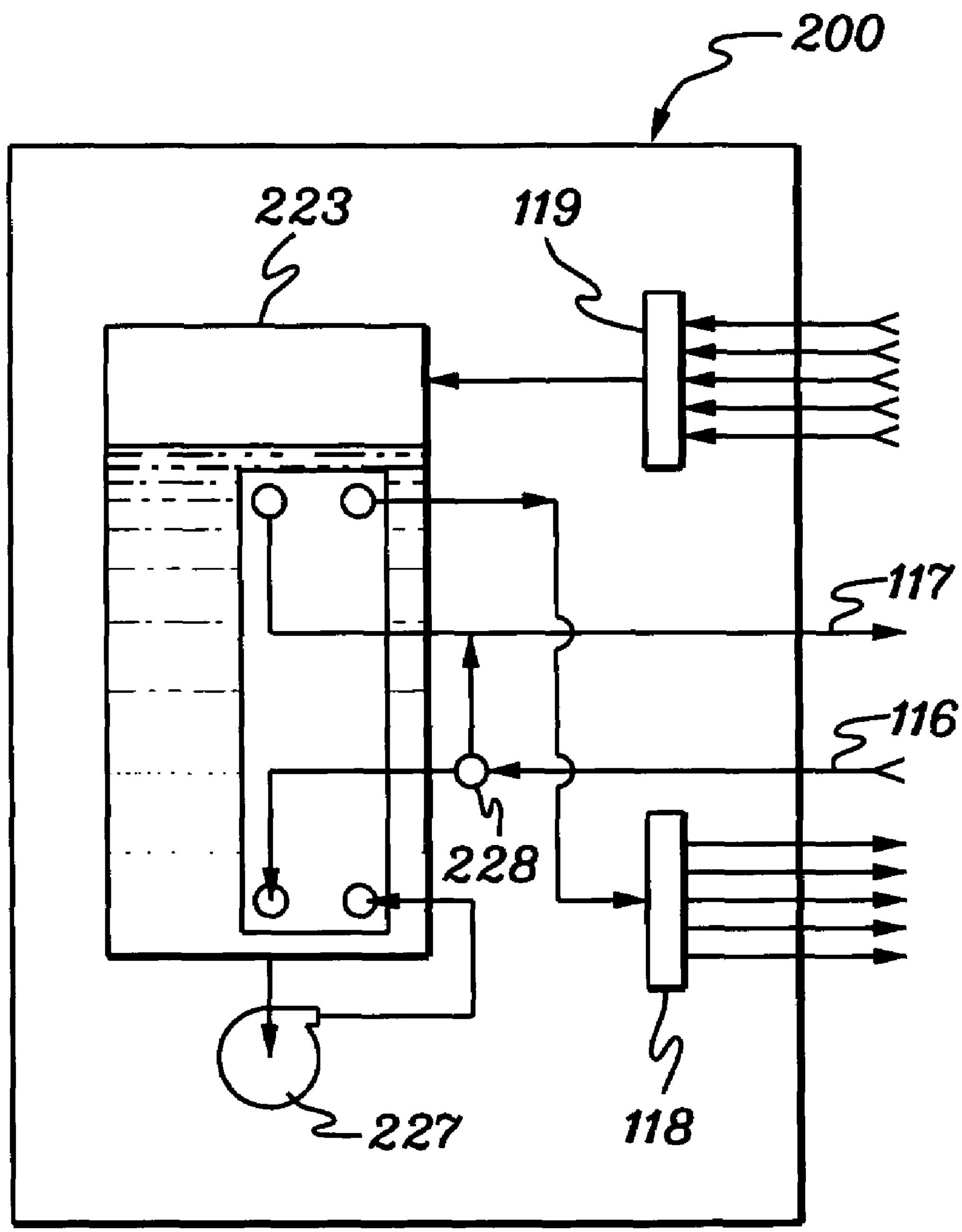
FIG. 2 is a schematic of one embodiment of a coolant distribution unit with an integrated heat exchanger/expansion tank, which can employ coolant monitoring, in accordance with an aspect of the present invention.

FIG. 2 illustrates one embodiment of a scalable coolant conditioning unit (SCCU) 200. Within unit 200 would be a power regulator and controller (not shown). System coolant returning from the electronics racks is collected in a return manifold 119 and directed through the expansion tank section of an integral heat exchanger/expansion tank 223, as described in detail in the above-incorporated U.S. patent application titled "Scalable Coolant Conditioning Unit with Integral Plate Heat Exchanger/Expansion Tank and Method of Use." From expansion tank 223, system coolant is directed to one or more pumping units 227. The higher pressure discharge of the pump(s) is directed to the "hot side" of the heat exchanger within the integral heat exchanger/expansion tank 223. The pump(s) can be connected to the manifolds via an insertion facilitation mechanism comprising automatic coupling assemblies (not shown), which are connected via flexible hoses to an isolation valve mechanism comprising a plurality of solenoid operated isolation valves. Alternatively, the isolation valves could be manually operated either locally or remotely, and the automatic coupling assemblies could be replaced by manually operated quick disconnects.

Having been cooled by the facility chilled water flowing through the "cold side" of the heat exchanger (116, 117), the system coolant is sent to the supply manifold 118 which distributes the coolant to the one or more electronics racks requiring cooling. Although not shown here, the SCCU could also incorporate means to filter the system water and automatically add a corrosion inhibitor such as benzotriazole (BTA) as needed. A two-way control valve 228 is used to regulate the flow rate of the facility chilled water to the heat exchanger within the integral heat exchanger/expansion tank 223, thereby controlling the temperature of system coolant delivered to the electronics racks. A thermistor temperature sensing element (not shown) can be located at the inlet of the system coolant supply manifold 118 to supply an electronic signal to the power/controller controlling operation of valve 228. If the system coolant temperature is higher than desired, valve 228 can be opened more allowing an increased flow of facility water through the heat exchanger resulting in a decrease of the temperature of the system water directed to the electronics racks from supply manifold 118. Alternatively, if the system water temperature is lower than desired, valve 228 can be closed more providing a decreased flow of facility water through the heat exchanger, resulting in an increase in the temperature of the system water directed to the electronics racks from supply manifold 118.

As noted initially above, any leak in a cooling system such as depicted in FIGS. 1 & 2, could cause all the frames of a computing environment to lose conditioned water. Thus, a single leak could bring down an entire computer room floor. For example, although improbable, such a leak could result if a break occurred in one of the coolant lines to or from the electronics subsystems. In many coolant distribution unit designs, such as depicted in FIGS. 1 & 2, a water level sensor was provided within the water reservoir or expansion tank to monitor the volume of liquid within the tank.

Figure 3:
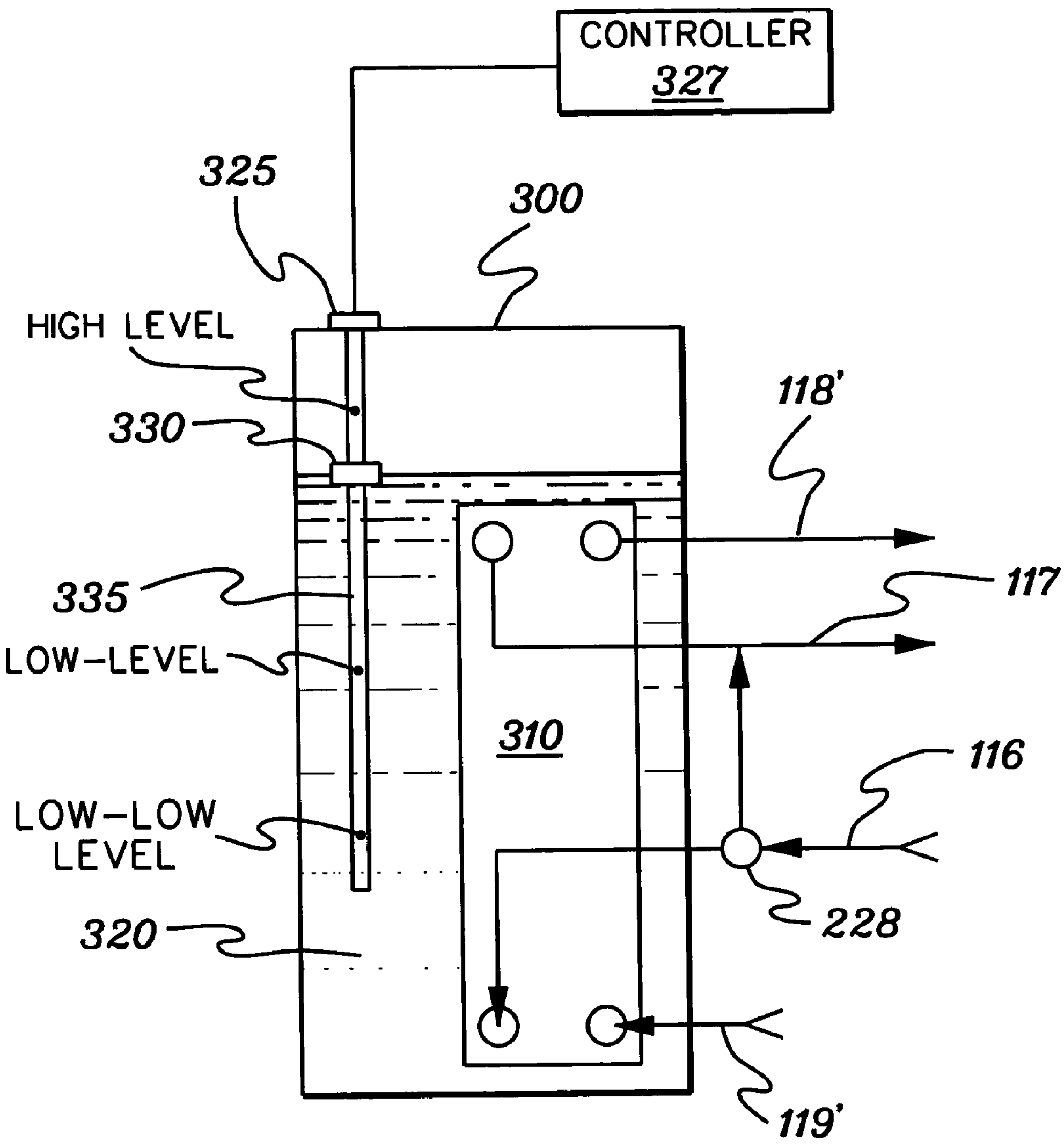
FIG. 3 depicts one embodiment of a system for monitoring coolant level within an expansion tank of a cooling system, wherein the expansion tank is shown with an integral heat exchanger therein.

FIG. 3 depicts one partial embodiment of a coolant distribution unit having an integrated heat exchanger/expansion tank 300. As shown, the integrated heat exchanger/expansion tank 300 includes a heat exchanger 310 disposed within an expansion tank having coolant 320, such as water, surrounding the heat exchanger. A water level sensor 325 is provided which includes a float 330 with embedded magnets and a tube 335 about which float 330 reciprocates with changes in the level of coolant within the expansion tank. Multiple reed switches, designated “high level”, “low level” and “low-low level” in FIG. 3, are used to determine whether the water level in the expansion tank is at a high set point, low set point or at a low-low set point.

Operationally, the integrated heat exchanger/expansion tank 300 of FIG. 3 is employed similar to that of FIG. 2. Having been cooled by the facility chilled water flowing through the “cold side” of the heat exchanger (116, 117), the system coolant is sent 118' to the supply manifold which distributes the coolant to the one or more electronics racks requiring cooling. A two way or three way control valve 228 is used to regulate the flow rate of the facility chilled water to the heat exchanger 310 within the integral heat exchanger/expansion tank 300, thereby controlling the temperature of system coolant delivered to the electronics racks. System water returns 119' to the integrated heat exchanger/expansion tank via a return manifold, which collects system coolant from the electronics racks.

As the liquid level within the expansion tank varies, the water level sensor 325 sends a signal to a controller 327 when float 330 (with the magnets disposed therein) passes a reed switch at one of the high level, low level or low-low level. Note that the high level reed switch is provided to guard against a possible leak in the heat exchanger which could be discharging facility coolant directly into the expansion tank. Conversely, if there is a leak outside the expansion tank, water level within the tank will drop and the water level sensor will note the magnitude of the drop when the float passes the low level reed switch or reaches the low-low level reed switch.

If the water level drops to the low-low level, then the coolant pump(s) are shut down, and the associated electronics system is also powered down. With today’s critical demand on high availability, this result is no longer tolerable, and a new mechanism is needed for sensing a leak in a cooling system before coolant in the expansion tank reaches a critically low level.

Figure 4:
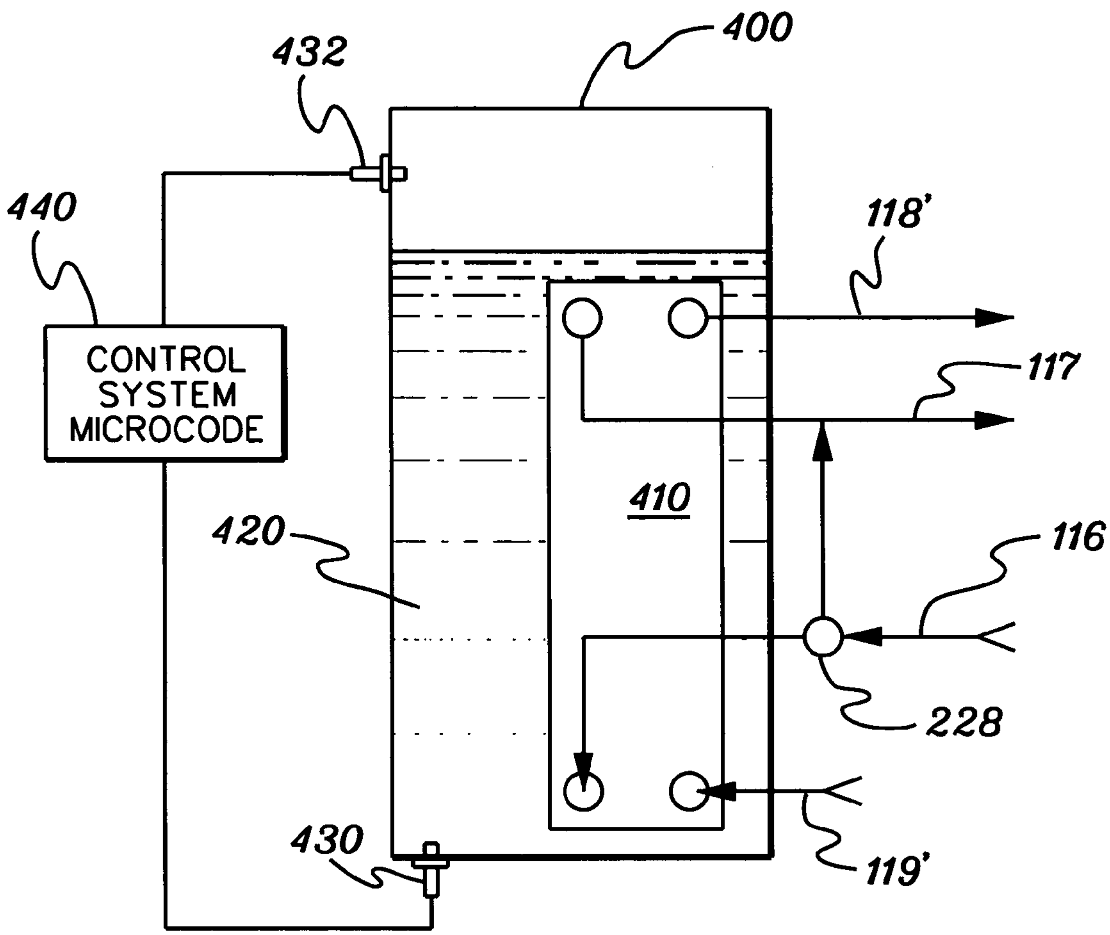
FIG. 4 depicts an alternate embodiment of a system for monitoring coolant volume and a rate of volume change of coolant within an integrated heat exchanger/expansion tank, in accordance with an aspect of the present invention.

FIG. 4 depicts one embodiment of an integrated heat exchanger/expansion tank 400 employing coolant monitoring in accordance with an aspect of the present invention. Note that FIG. 4 denotes one possible embodiment, wherein one pressure sensor 430 is coupled to a bottom portion of the tank and a second (optional) pressure sensor 432 is coupled to a top portion of the tank. Note, also, that integration of the heat exchanger 410 within the expansion tank is merely provided as one example. Alternatively, the expansion tank and heat exchanger could comprise separate components within the coolant distribution unit. Facility chilled water and system water flow to and from the heat exchanger would be similar to that described above in connection with FIGS. 2 & 3.

In this monitoring embodiment, the water (or more generally coolant) 420 level is determined using, for example, a hydrostatic pressure transducer mounted in the bottom of the expansion tank. The signal provided by this transducer is monitored and recorded at regular intervals by the control system microcode 440. The pressure at the bottom of the expansion tank is directly proportional to the head of water (i.e., level of water) within the tank. By taking successive pressure measurements and dividing by the time between measurements, it is possible to determine a rate of change of water volume in the tank. The control system microcode can be programmed to compare the rate of volume change against preset criteria to determine if a serious leak is present and initiate an appropriate action when needed. In addition, by sensing pressure at the bottom of the expansion tank, the control system microcode may also be used under more normal circumstances to determine if and when there is a need to add water to the tank to compensate for normal losses due to evaporation. In an enhanced embodiment, second sensor 432 is provided to allow for determination of a differential pressure measurement, which can then be used to determine a rate of volume change of coolant within the tank as explained further below in connection with FIG. 5A.

Figure 5A:
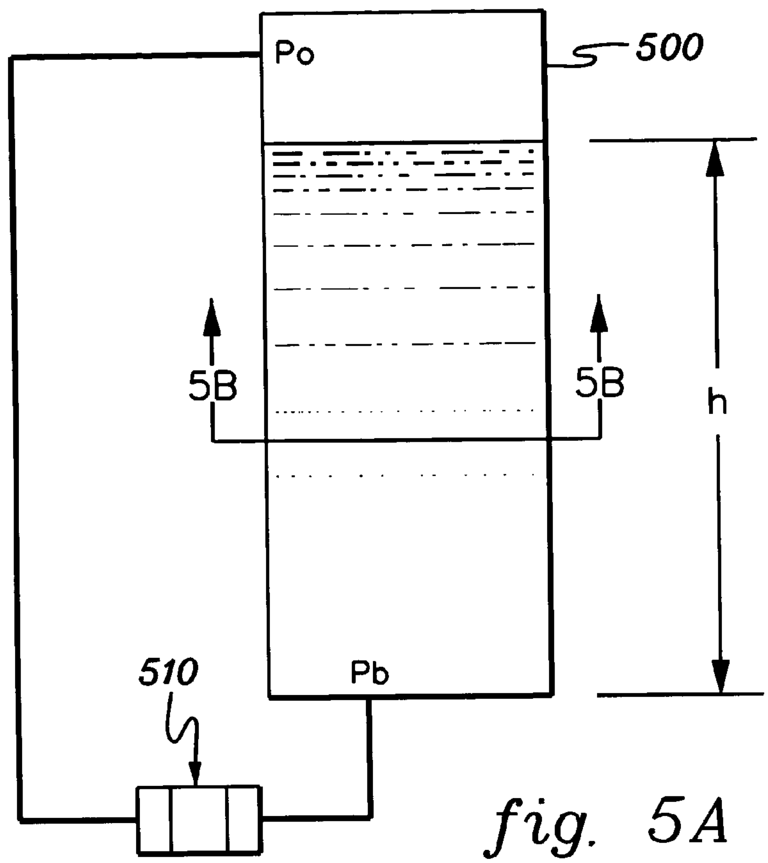
FIG. 5A depicts one embodiment of a cooling system expansion tank and differential pressure transducer for use in monitoring coolant volume and a rate of volume change of coolant within the expansion tank, in accordance with an aspect of the present invention.

FIG. 5A depicts an alternate embodiment of an expansion tank 500 of a coolant distribution unit to employ coolant monitoring in accordance with an aspect of the present invention. Pressure within the tank is measured in this example at two different locations, namely, pressure reading Pb (which is the pressure at the bottom of the tank) and pressure reading Po (which is the pressure at the top of the tank above the liquid level) are obtained. A single differential pressure transducer 510 can be employed as a sensor to directly measure the difference in pressure between Pb and Po. This difference can be expressed as equation 1:

$$\Delta P = Pb - Po = \rho g h \quad \text{(Eq. 1)}$$

wherein:

ΔP=differential pressure, Pb−Po.

Pb=pressure at bottom of tank.

Po =pressure at top of tank (above liquid level).

ρ=liquid density.

g=gravity.

h=liquid height in tank.

Equation 1 can be solved for the height (h) of the liquid within the expansion tank and written as equation 2:

$$h = \frac{\Delta P}{\rho g} \quad \text{(Eq. 2)}$$

Once the height of the liquid within the expansion tank is known, the volume of liquid within the tank can be determined by equation 3:

$$V=Ah \quad \text{(Eq. 3)}$$

wherein:

V=Volume of liquid in tank.

A=tank cross-sectional area.

h=liquid height in tank.

Figure 5B:
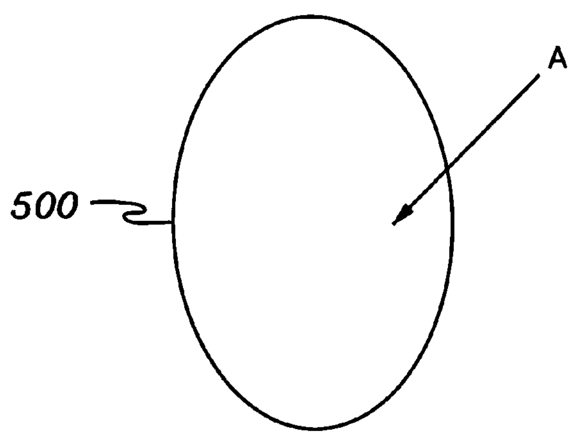
FIG. 5B depicts a cross-sectional view of the expansion tank of FIG. 5A, taken along line 5B—5B.

Note that this example assumes a uniform cross-sectional area for the expansion tank, as shown in FIGS. 5A & 5B. However, those of ordinary skill in the art can readily provide the necessary equations in order to determine liquid volume for a given expansion tank configuration.

By taking successive differential pressure measurements and converting the pressure measurements into change in volume, it is possible to determine a rate of volume change of liquid within the tank (or leak rate from the expansion tank), as expressed in equation 4:

$$\frac{\Delta V}{\Delta t} = \text{rate of change of tank volume} = \text{leak rate} \quad \text{(Eq. 4)}$$

Wherein:

Δt=time interval.

Figure 6:
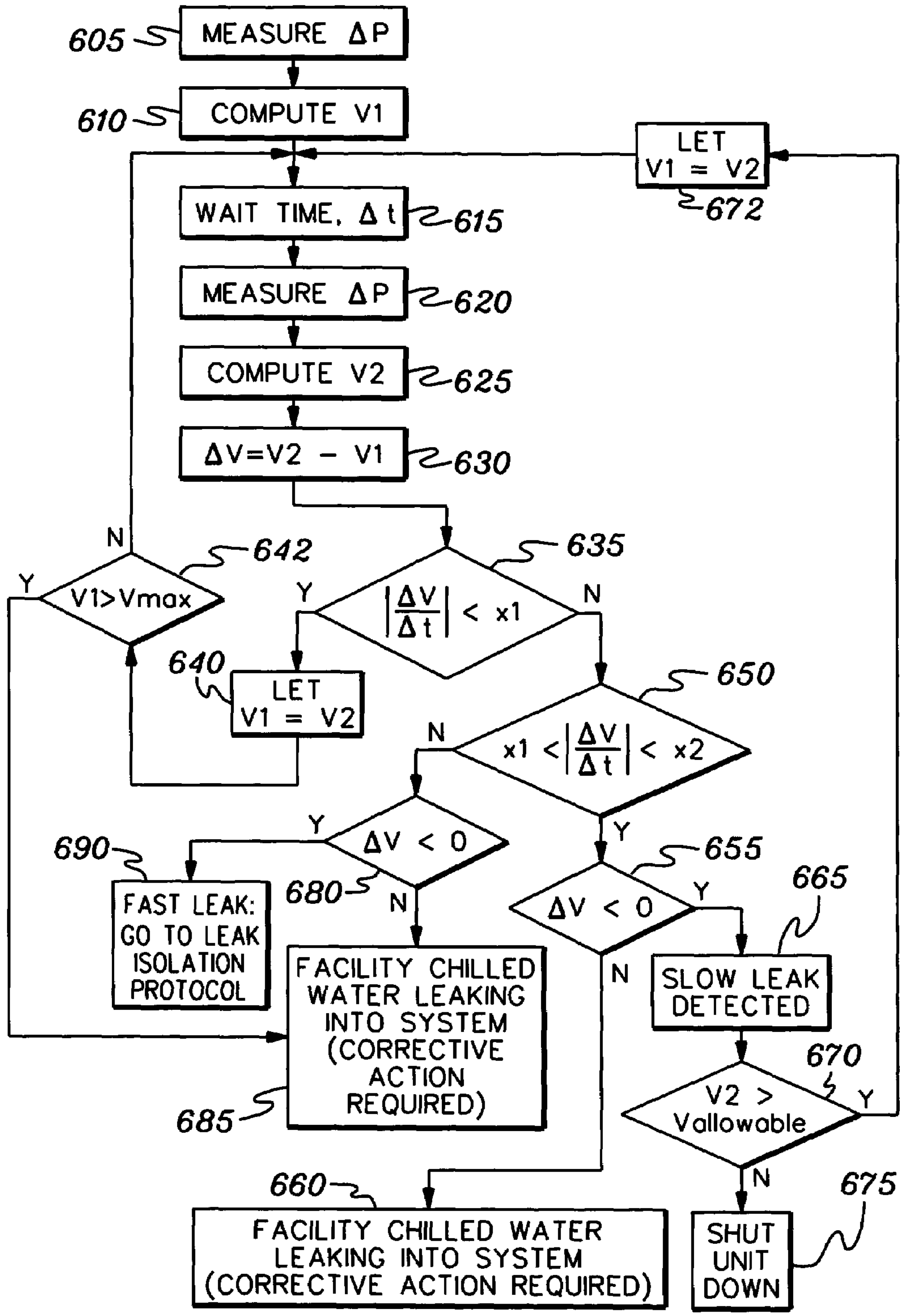
FIG. 6 depicts one embodiment of a flowchart for monitoring coolant volume and a rate of volume change of coolant within a cooling system and for determining whether action is to be currently taken based thereon, in accordance with an aspect of the present invention.

FIG. 6 is one flowchart example of processing implemented by the control system microcode in accordance with an aspect of the present invention. This processing begins with measuring of the differential pressure 605 at time t1, using for example, equation 1. Once obtained, the volume of liquid within the expansion tank at time t1 is determined 610. After waiting a known interval of time (Δt) 615, the differential pressure is again measured 620 at time t2 and a volume of liquid in the expansion tank at time t2 is computed 625. The change in volume between time t1 and time t2 is then determined by subtracting the computed volume v1 at time t1 from the volume v2 at time t2 630. A condition statement 635 determines whether the magnitude of the change in volume (ΔV) divided by the known time interval (Δt) between measurements is less than a first threshold value or first leak rate set point x1. This statement seeks to determine whether the rate of volume change of coolant within the expansion tank is within normal operating parameters.

If the magnitude is less than the first threshold value x1, then the measured volume at time t2 is reassigned to comprise the measured volume at time t1 640 and determination is made whether volume V1 is greater than a defined maximum volume Vmax 642. If "yes", facility chilled water is leaking into the system and corrective action is required 685. Otherwise, the process repeats with a waiting of the known time interval 615 before making the next differential pressure measurement. Assuming that the condition statement 635 is not satisfied, then processing determines whether the rate of volume change of coolant within the expansion tank is between the first threshold and a second threshold value or second leak rate set point x2 650. If "yes", then a slow leak has been identified and processing determines whether the change in volume between measured time t1 and time t2 is less than zero, i.e., is volume V1 larger than volume V2. If "no", then facility chilled water is leaking into the expansion tank and corrective action is required 660. If "yes", then a slow leak is detected 665 (and notice thereof can be provided to an operator of the computing environment), and processing determines whether the volume of coolant within the expansion tank at time t2 is greater than a minimum allowable volume Vallowable 670. If the volume has dropped below the minimum allowable level, then the coolant distribution unit is shut down 675, otherwise monitoring continues by reassigning the measured volume at time t2 to comprise the measured volume at time t1 672, and waiting for the next time interval to pass 615 before repeating the measurements.

From condition statement 650, if the rate of volume change of coolant within the expansion tank is greater than the second threshold value x2, then a fast leak has been identified, and processing determines whether the change in volume is less than zero 680, i.e., is the volume measurement at time t1 larger than the volume measurement at time t2. If so, then leak isolation protocol can be automatically initiated 690, for example, as described in the above-incorporated, co-filed patent application. Otherwise, facility chilled water is leaking into the system and corrective action is required 685.

The present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of monitoring coolant within a cooling system, the method comprising:

employing at least one pressure transducer to facilitate obtaining multiple pressure measurements related to an amount of coolant within an expansion tank of the cooling system;

determining a rate of volume change of coolant within the expansion tank employing the multiple pressure measurements;

determining whether the amount of coolant within the expansion tank of the cooling system is increasing or decreasing due to a cooling system defect;

automatically determining type and immediacy of action to be taken to service the cooling system responsive to a comparison of a magnitude of the rate of volume change of coolant within the expansion tank to multiple predefined leak rate set points, and to the determining whether the amount of coolant within the expansion tank of the cooling system is increasing or decreasing;

wherein the employing comprises obtaining successive pressure measurements related to the amount of coolant within the expansion tank of the cooling system, the successive pressure measurements being taken at a known time interval, and wherein the determining comprises employing the successive pressure measurements at the known time interval to determine the rate of volume change of coolant within the expansion tank; and further comprising automatically determining whether the magnitude of the rate of volume change of coolant within the expansion tank is less than a first leak rate set point, and if so, continuing monitoring of coolant within the cooling system, otherwise, determining whether the magnitude of the rate of volume change of coolant within the expansion tank is between the first leak rate set point and a second leak rate set point, and if so, and if the amount of coolant within the expansion tank is increasing, then signaling for corrective action to address the increase in the amount of coolant within the expansion tank.

2. The method of claim 1, wherein the cooling system is a closed loop cooling system.

3. The method of claim 1, further comprising automatically determining whether the amount of coolant within the expansion tank is above a minimum volume threshold, and if not, signaling for the cooling system to be shut down, otherwise, continuing with monitoring of coolant level within the cooling system.

4. The method of claim 1, further comprising automatically determining whether the rate of volume change of coolant within the expansion tank is greater than the second leak rate set point, and if so, signaling for immediate action to be taken to service the cooling system, wherein the immediate action to be taken is dependent upon whether volume of coolant within the expansion tank is increasing or decreasing.

5. The method of claim 1, wherein the employing comprises automatically employing the at least one pressure transducer to obtain multiple differential pressure measurements on the amount of coolant within the expansion tank, each differential pressure measurement comprising a difference in pressure between pressure in a liquid coolant portion of the expansion tank less pressure in a non-liquid portion of the expansion tank.

6. The method of claim 5, wherein the at least one pressure transducer comprises a differential pressure transducer for determining the multiple differential pressure measurement.

7. A system for monitoring coolant within a cooling system, the system comprising:

at least one pressure transducer coupled to an expansion tank of the cooling system, wherein the at least one pressure transducer facilitates obtaining multiple pressure measurements related to an amount of coolant within the expansion tank;

means for determining a rate of volume change of coolant within the expansion tank employing the multiple pressure measurements;

means for determining whether the amount of coolant within the expansion tank of the cooling system is increasing or decreasing due to a cooling system defect;

means for automatically determining type and immediacy of action to be taken to service the cooling system responsive to a comparison of a magnitude of the rate of volume change of coolant within the expansion tank to multiple predefined leak rate set points, and to the determining whether the amount of coolant within the expansion tank of the cooling system is increasing or decreasing; and wherein the means for employing comprises means for automatically employing the at least one pressure transducer to obtain multiple differential pressure measurements on the amount of coolant within the expansion tank, each differential pressure measurement comprising a difference in pressure between pressure in a liquid coolant portion of the expansion tank less pressure in a non-liquid portion of the expansion tank.

8. The system of claim 7, wherein the cooling system is a closed loop cooling system.

9. The system of claim 7, wherein the at least one pressure transducer comprises a differential pressure transducer for determining the multiple differential pressure measurement.

10. The system of claim 7, wherein the at least one pressure transducer obtains successive pressure measurements related to the amount of coolant within the expansion tank of the cooling system, the successive pressure measurements being taken at a known time interval, and wherein the means for determining comprises means for employing the successive pressure measurements at the known time interval to determine the rate of volume change of coolant within the expansion tank.

11. The system of claim 10, further comprising means for automatically determining whether a magnitude of the rate of volume change of coolant within the expansion tank is less than a first leak rate set point, and if so, for continuing monitoring of coolant within the cooling system, otherwise, for determining whether the magnitude of the rate of volume change of coolant within the expansion tank is between the first leak rate set point and a second leak rate set point, and if so, and if the means for determining whether the amount of coolant within the expansion tank determines that the amount is increasing, then for signaling for corrective action to address the increase in the amount of coolant within the expansion tank.

12. The system of claim 11, further comprising means for automatically determining whether the amount of coolant within the expansion tank is above a minimum volume threshold, and if not, for signaling for the cooling system to be shut down, otherwise for continuing with monitoring of coolant level within the cooling system.

13. The system of claim 11, further comprising means for automatically determining whether the rate of volume change of coolant within the expansion tank is greater than the second leak rate set point, and if so, for signaling for immediate action to be taken to service the cooling system, wherein the immediate action to be taken is dependent upon whether volume of coolant within the expansion tank is increasing or decreasing.

14. A method of monitoring coolant within a cooling system, the method comprising:

(i) employing at least one pressure transducer to facilitate obtaining multiple pressure measurements related to an amount of coolant within an expansion tank of the cooling system;

(ii) determining a rate of volume change of coolant within the expansion tank employing the multiple pressure measurements;

(iii) determining whether a magnitude of the rate of volume change of coolant with the expansion tank is less than a first leak rate set point, and if so, determining whether the amount of coolant within the expansion tank is greater than a preset maximum allowable, and if so, automatically signaling for corrective action to be taken on the cooling system, otherwise repeating the employing (i) and the determining (ii);

(iv) if the magnitude of the rate of volume change of coolant within the expansion tank is greater than the first leak rate set point, determining whether the magnitude of the rate of volume change of coolant within the expansion tank is greater than a second leak rate set point larger than the first leak rate set point, and if so, determining whether the amount of coolant within the expansion tank is increasing, and if so, automatically signaling for corrective action to be taken on the cooling system, otherwise determining that a fast coolant leak exists, and automatically initiating leak isolation protocol; and (v) if the magnitude of the rate of volume change of coolant within the expansion tank is between the first leak rate set point and the second leak rate set point, determining whether the amount of coolant within the expansion tank is increasing, and if so, automatically signaling for corrective action to be taken on the cooling system, otherwise detecting existence of a slow leak in the cooling system, and determining whether the amount of coolant within the expansion tank is above a minimum allowable amount for operation of the cooling system, and if so, repeating the employing (i) and the determining (ii), otherwise automatically shutting down the cooling system.

15. The method of claim 14, wherein the cooling system is a closed loop system.

* * * * *